(12) United States Patent
Yeh et al.

(10) Patent No.: US 12,463,065 B2
(45) Date of Patent: Nov. 4, 2025

(54) GAS FLOW CONTROL DURING SEMICONDUCTOR FABRICATION

(71) Applicant: TAIWAN SEMICONDUCTOR MANUFACTURING COMPANY LIMITED, Hsin-Chu (TW)

(72) Inventors: Yu-Liang Yeh, Kaohsiung (TW); Chih-Kang Chao, Tainan (TW); Bing Kai Huang, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 609 days.

(21) Appl. No.: 17/876,845

(22) Filed: Jul. 29, 2022

(65) Prior Publication Data

US 2022/0375770 A1 Nov. 24, 2022

Related U.S. Application Data

(62) Division of application No. 16/991,168, filed on Aug. 12, 2020.

(51) Int. Cl.
*H01L 21/67* (2006.01)
*H01J 37/32* (2006.01)
*H01L 21/306* (2006.01)
*H01L 21/3213* (2006.01)
(Continued)

(52) U.S. Cl.
CPC .. *H01L 21/67069* (2013.01); *H01J 37/32623* (2013.01); *H01J 37/32816* (2013.01); *H01J 37/32834* (2013.01); *H01L 21/30604* (2013.01); *H01L 21/32136* (2013.01);
(Continued)

(58) Field of Classification Search
CPC ......... H01L 21/67069; H01L 21/30604; H01L 21/32136; H01L 21/311; H01L 21/67017; H01L 21/67155; H01L 21/67207; H01J 37/32623; H01J 37/32816;
(Continued)

(56) References Cited

U.S. PATENT DOCUMENTS 5,441,568 A * 8/1995 Cho .................... C23C 16/4412
118/728
6,402,847 B1 * 6/2002 Takagi .............. H01L 21/67017
118/723 R
(Continued)

FOREIGN PATENT DOCUMENTS

WO 0237548 A1 5/2002
WO 2014046081 A1 3/2014

OTHER PUBLICATIONS

1 First Office Action received in corresponding Chinese patent application No. 202110031932.2, Jul. 24, 2024, 16 pages.

*Primary Examiner* — Duy Vu N Deo
(74) *Attorney, Agent, or Firm* — Cooper Legal Group, LLC

(57) ABSTRACT

A method is provided. The method includes introducing a process gas into an interior space of a processing chamber through a gas inlet port, wherein a substrate is supported within the interior space. The process gas is evacuated from the interior space by a vacuum source through an exhaust port in fluid communication with the interior space of the process chamber. A flow of the process gas is controlled by supporting an exhaust baffle within a flow path of the process gas being evacuated from the interior space through the exhaust port.

20 Claims, 5 Drawing Sheets

(51) Int. Cl.
   *C23C 16/44*      (2006.01)
   *H01L 21/311*     (2006.01)
(52) U.S. Cl.
   CPC ..... *C23C 16/4412* (2013.01); *H01J 37/32449* (2013.01); *H01L 21/311* (2013.01); *Y10S 438/935* (2013.01)
(58) Field of Classification Search
   CPC ........... H01J 37/32834; H01J 37/32449; H01J 37/32431; C23C 16/4412; Y10S 438/935
   USPC ........................................................ 216/58
   See application file for complete search history.

(56)           References Cited

U.S. PATENT DOCUMENTS

| 2006/0151114 | A1* | 7/2006 | Fink | H01J 37/3244 |
| | | | | 118/715 |
| 2008/0066785 | A1 | 3/2008 | Vesci et al. | |
| 2009/0250169 | A1* | 10/2009 | Carducci | H01J 37/32495 |
| | | | | 156/345.1 |
| 2013/0284288 | A1 | 10/2013 | Kim | |

\* cited by examiner

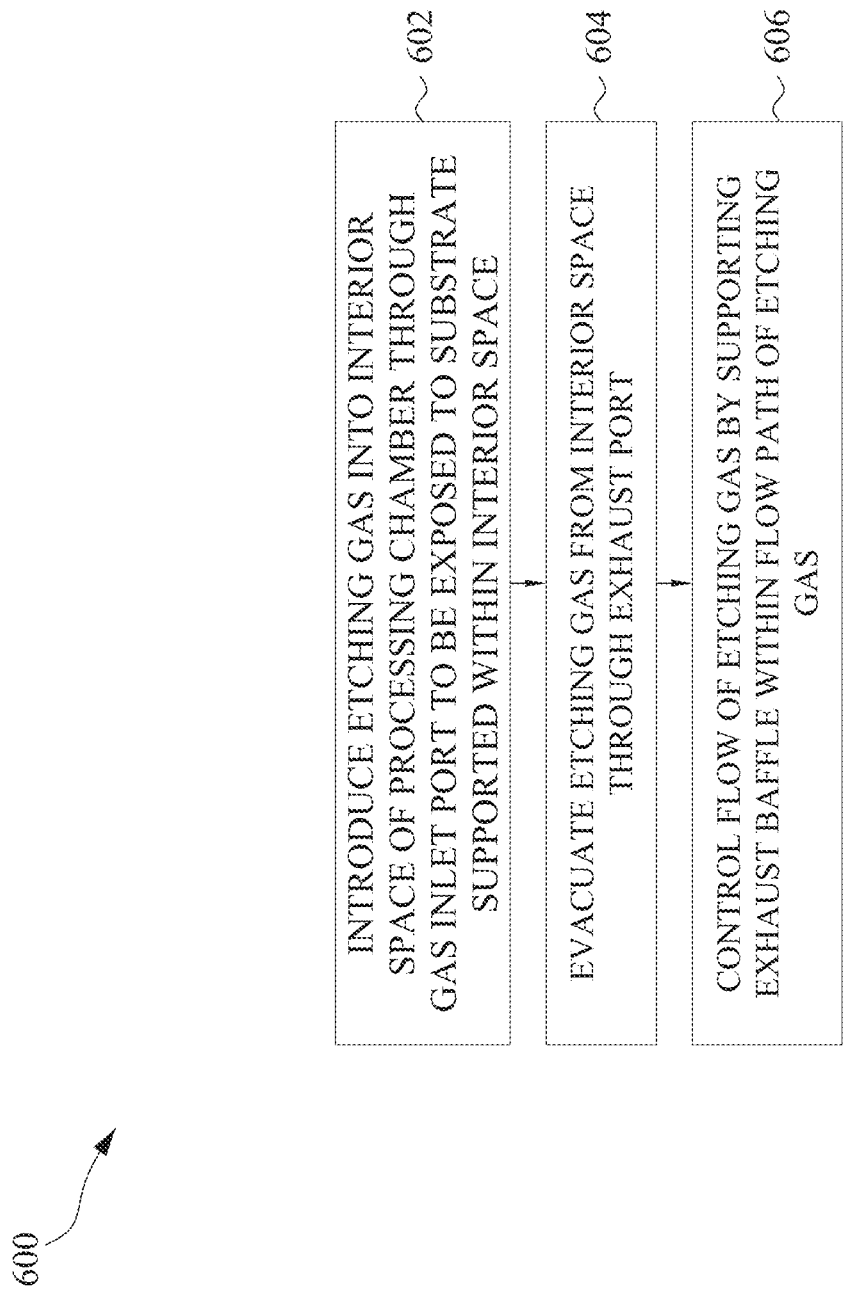

GAS FLOW CONTROL DURING SEMICONDUCTOR FABRICATION

RELATED APPLICATION

This application is a divisional of and claims priority to U.S. patent application Ser. No. 16/991,168, titled "GAS FLOW CONTROL DURING SEMICONDUCTOR FABRICATION" and filed on Aug. 12, 2020, which is incorporated herein by reference.

BACKGROUND

Generally, during semiconductor fabrication various layers of material are formed on a substrate, such as a semiconductor wafer. The layers are often patterned to formed semiconductor features, such as different elements of transistors. Etching is a process used in semiconductor fabrication to patterns the layers and establish such features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates is a flow diagram depicting a method of establishing a flow of an etching gas over a substrate, according to some embodiments.

DETAILED DESCRIPTION

Figure 1:
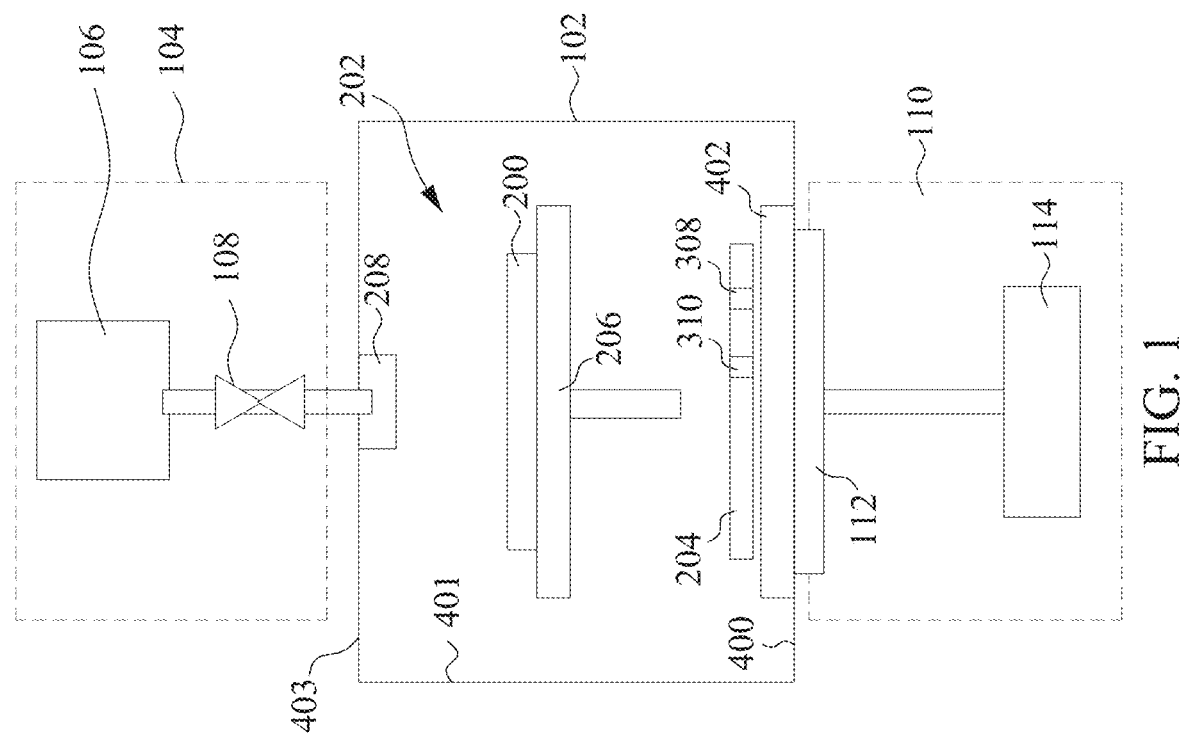
FIG. 1 illustrates a block diagram schematically depicting a semiconductor processing system, according to some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a semiconductor processing system includes a gas source that supplies an etching gas to a process chamber, and a vacuum source that evacuates at least a portion of the etching gas from the process chamber. In some embodiments, the process chamber includes a peripheral wall that extends upward from a floor to define an interior space. A substrate support is disposed within the interior space to support a semiconductor substrate within a flow path of an etching gas during a semiconductor fabrication process. In some embodiments, a gas inlet port is fluidly coupled to the gas source, to allow the etching gas supplied by the gas source to enter the interior space and be exposed to a surface of the substrate supported by the substrate support. The exhaust port is fluidly coupled to the vacuum source, which establishes a partial vacuum that evacuates at least a portion of the etching gas from the interior space of the process chamber through the exhaust port, and establishes a flow of the etching gas over the substrate supported by the substrate support.

An etching gas is used herein as an example of a process gas, and the exhaust baffle is therefore described as promoting a relatively uniform etch rate using the etching gas. However, the process gas described herein is not limited to an etching gas. Any other gaseous substance that can be introduced to a process chamber, such as to process a semiconductor wafer, is considered within the scope of the present disclosure.

In some embodiments, an exhaust baffle is supported within the flow path of the etching gas being evacuated from the interior space through the exhaust port. The exhaust baffle modifies the flow of the etching gas over the substrate supported by the substrate support. The exhaust baffle includes a first region that restricts the flow path of the etching gas through the first region of the exhaust baffle toward the exhaust port. A second region of the exhaust baffle defines an aperture allowing substantially unrestricted flow of the etching gas through a second region of the exhaust baffle toward the exhaust port. The combination of the restricted air flow path and the substantially unrestricted air flow path modifies the flow of the etching gas, and promotes uniformity of the flow pattern or flow rate of the etching gas over the substrate supported by the substrate support. For example, a first flow rate of a first portion of the etching gas over a first portion of the substrate is equal or substantially equal to a second flow rate of a second portion of the etching gas over a second portion of the substrate. A uniform flow rate of the etching gas over the substrate promotes uniform etching across the substrate, such that one area of the substrate is not etched differently, or is etched less differently, than another area of the substrate. Uniform etching or etch rates across the substrate improve yield at least because resulting devices, such as transistors, formed across the wafer perform in a similar manner, such as having little to no variance in threshold voltages.

FIG. 1 illustrates a block diagram schematically depicting a semiconductor processing system 100, according to some embodiments. The illustrated semiconductor processing system 100 includes a process chamber 102 having a peripheral wall 401 extending between a floor 400 and a ceiling 403 to define an interior space 202. A substrate 200, such as a semiconductor wafer, is supported on a substrate support 206 in the process chamber 102 so that the substrate 200 can be subjected to at least some of a semiconductor fabrication process performed in the process chamber 102.

In some embodiments, the semiconductor fabrication process comprises an etching operation such that the semiconductor processing system 100 includes a gas source 104 that introduces an etching gas to the process chamber 102 through a gas inlet port 208. For example, the etching gas is stored in a cylinder 106 that is fluidly coupled to the process chamber 102 through a control valve 108 that regulates the flow of the etching gas from the cylinder 106 to the gas inlet port 208.

In some embodiments, the semiconductor processing system 100 includes a vacuum source 110 that is fluidly coupled to the process chamber 102 through an exhaust port 402 to expose the process chamber to a partial vacuum established by the vacuum source 110. The partial vacuum is generally at a lower pressure than a pressure within the interior space 202 of the process chamber 102 such that at least a portion of the etching gas moves along a flow path from the process chamber 102 to the vacuum source 110 through the exhaust port 402. The vacuum source 110 includes a vacuum pump 114, such as a turbo pump or any other suitable pump that is operable to establish a pressure that is less than the pressure within the interior space 202 of the process chamber 102. In some embodiments the vacuum source 110 includes an adaptive pressure controller 112 that regulates a pressure to which the interior space 202 of the process chamber 102 is exposed via the vacuum pump 114.

According to some embodiments, the vacuum source 110 establishes at least a rough vacuum, having a pressure of less than 760 Torr, down to about 1 Torr. In some embodiments, the vacuum source 110 establishes at least a medium vacuum, having a pressure that is no greater than 1 Torr, down to about $1 \times 10^{-3}$ Torr. In some embodiments, the vacuum source 110 establishes at least a high vacuum, having a pressure that is no greater than $1 \times 10^{-3}$ Torr, down to about $1 \times 10^{-7}$ Torr. In some embodiments, the vacuum source 110 establishes at least an ultra-high vacuum, having a pressure that is less than $1 \times 10^{-7}$ Torr.

In some embodiments, the floor 400 is annular, the ceiling 403 is annular, and the peripheral wall 401 is cylindrical such that at least some of the interior space 202 is generally a cylindrical volume. In some embodiments, the exhaust port 402 is defined, at least in part, by a circular aperture in the floor 400. In some embodiments the adaptive pressure controller 112 includes a circular shaped seal member that can be selectively positioned, such as via a pendulum or arm, to block the exhaust port 402 to varying degrees. For example, the seal member is circular and has a diameter that is at least as large as the diameter of the exhaust port 402.

When the seal member and the exhaust port 402 are misaligned such that the seal member blocks some but not all of the exhaust port 402, a crescent shaped aperture is defined between an edge of the circular seal member and the edge of the floor 400 defining the circular aperture of the exhaust port 402. The etchant gas moves from the interior space 202 to the vacuum source 110 through the crescent shaped aperture. The size of the crescent shaped aperture is adjustable based upon the degree to which the seal member and the exhaust port 402 are misaligned.

An exhaust baffle 204 is disposed proximate the exhaust port 402 to regulate a flow of etching gas from the interior space 202 to the vacuum source 110. In the absence of the exhaust baffle 204, given the dimension and location of the crescent shaped aperture, the etching gas would not be uniformly removed from the interior space 202 and would not uniformly flow across the substrate 200. For example, a first portion of the etching gas closer to the crescent shaped aperture would move at a first flow rate greater than a second flow rate of a second portion of the etching gas farther away from the crescent shaped aperture.

In some embodiments, the exhaust baffle 204 is formed as an arcuate structure, such as an annular ring for example, that extends about an entire angular extent of the exhaust port 402 of the process chamber 102. The exhaust baffle 204 is cut from a sheet of material, molded or otherwise formed into the arcuate shape and has a depth dimension within a range of about two millimeters (2 mm) to about ten millimeters (10 mm). However, exhaust baffles 204 having a depth dimension outside of the above range are also within the scope of the present disclosure.

In some embodiments, the exhaust baffle 204 has a diameter that closely approximates a diameter of the exhaust port 402, falling within a range of about forty centimeters (40 cm) to about seventy-five centimeters (75 cm). However, exhaust baffles 204 having a diameter outside of the above range are also within the scope of the present disclosure. In some embodiments, the exhaust baffle 204 is formed as an arcuate segment that does not extend a full three hundred sixty degrees about a central axis to form a complete loop, instead extending about a portion but less than an entire angular extent of the exhaust port 402. Regardless of the shape, some embodiments of the exhaust baffle 204 are constructed from a material that is not electrically conductive, having an electrical conductivity of no greater than $10^{-10}$ $\Omega^{-1}m^{-1}$, and is not reactive with a plasma generated within the process chamber 102, or any other gas or other material utilized within the process chamber 102 during a fabrication operation. Examples of the non-conductive material comprise, but are not limited to, polytetrafluoroethylene ("PTFE"), a ceramic material, or any other material that is inert or not reactive with the plasma or other substances to which the exhaust baffle 204 is expected to be exposed during a fabrication operation within the process chamber 102.

The exhaust baffle 204 has a first region 308 that restricts, to a first degree, the flow path of the etching gas toward the exhaust port, and a second region 310 that restricts, to a second degree, different than the first degree, the flow path of the etching gas toward the exhaust port. In some embodiments, the second degree is much smaller than the first degree such that the etching gas flows generally unrestricted through the second region 310 of the exhaust baffle 204, whereas flow of the etching gas is somewhat restricted through the first region 308 of the exhaust baffle 204.

In some embodiments, the first region 308 defines a plurality of vent apertures that have a collective cross-sectional flow area that is less than a cross-sectional flow area of an aperture defined by the second region 310 of the exhaust baffle 204. The exhaust baffle 204 is positioned relative to the crescent shaped aperture such that the first region 308 and the second region 310 facilitate uniform removal of the etching gas from the interior space 202 and thereby uniform flow of the etching gas across the substrate 200 to promote uniform etching of the substrate 200. A first flow rate of a first portion of the etching gas over a first portion of the substrate is equal or substantially equal to a second flow rate of a second portion of the etching gas over a second portion of the substrate due to the orientation of the exhaust baffle 204 relative to the exhaust port 402.

Figure 2:
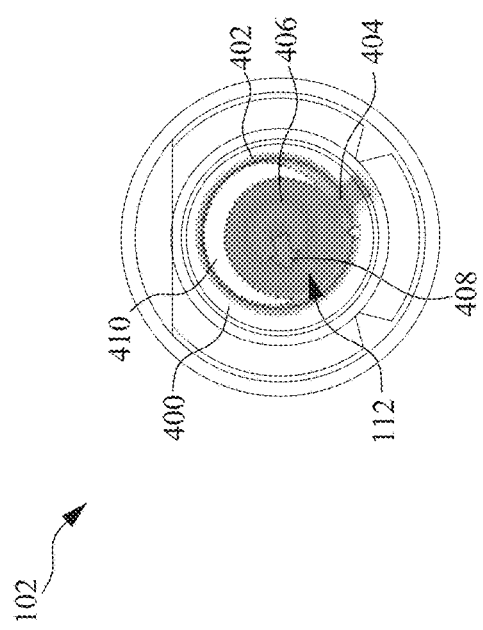
FIG. 2 illustrates a top view of at least some of a process chamber and an adaptive pressure controller depicting movement of a seal member to establish a crescent shaped aperture, according to some embodiments.

FIG. 2 illustrates a top view of at least some of the process chamber 102 and the adaptive pressure controller 112 depicting movement of the seal member 406 to establish a crescent shaped aperture 410 as a vacuum aperture through which the etching gas is drawn by the vacuum source 110, according to some embodiments. The crescent shaped aperture 410 is offset from a central region of the process chamber 102 and the exhaust port 402, and establishes different flow rates of the etching gas through different portions of the exhaust port 402. For example, a first amount of the etching gas is extracted at a first rate from the process chamber 102 through a first portion of the exhaust port 402 that is in substantial vertical alignment with the crescent shaped aperture 410. A second amount of the etching gas is extracted at a second rate from the process chamber 102 through a second portion of the exhaust port 402 that is not in substantial vertical alignment with the crescent shaped aperture 410, but laterally offset from the crescent shaped aperture 410. The first amount of the etching gas and/or the first rate at which the first amount is extracted from the process chamber 102 is greater than the second amount of the etching gas and/or the second rate at which the second amount is extracted from the process chamber 102, respectively.

The pendulum or arm 404 is pivotally adjustable to move the seal member 406 in an angular direction 408 relative to the edge of the floor 400 defining the circular aperture of the exhaust port 402. Moving the seal member 406 further in the direction 408 increases the size of the crescent shaped aperture 410. Moving the seal member 406 in a direction opposite to the direction 408 decreases the size of the crescent shaped aperture 410. Both movements of the seal member 406 alter the flow of the etching gas extracted through different portions of the exhaust port 402, resulting in variations in etch rates, for example, over the surface of the substrate 200.

Figure 3A:
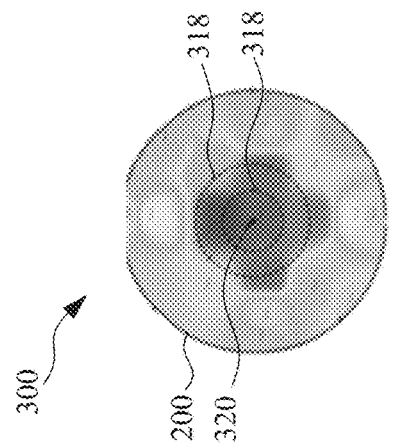
FIG. 3A illustrates a top view of at least some of a process chamber including an exhaust baffle that extends about an entire angular extent of an arcuate exhaust port to restricts a flow path of an etching gas toward the exhaust port, according to some embodiments.
Figure 3B:
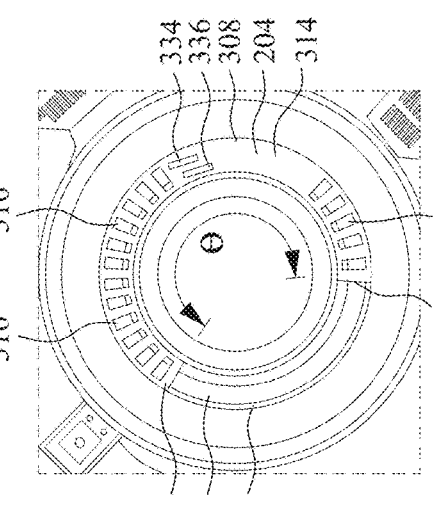
FIG. 3B illustrates a top view of at least some of a process chamber including an exhaust baffle that extends about a portion but less than an entire angular extent of an arcuate exhaust port to restrict a flow path of an etching gas toward the exhaust port, according to some embodiments.

FIG. 3A illustrates a top view of at least some of the process chamber 102 including the exhaust baffle 204, according to some embodiments. In some embodiments the exhaust baffle 204 is annular in shape and extends entirely about an angular extent of the exhaust port 402. In some embodiments, the exhaust baffle 204 is continuous, forming a complete ring. In some embodiments, such as shown in FIG. 3B, the exhaust baffle 204 is not continuous, such as having two ends 305, 307 that do not touch. The exhaust baffle 204 includes the first region 308 that restricts the flow path of the etching gas, and the second region 310 that defines an aperture 312 allowing substantially unrestricted flow of the etching gas. For the embodiment shown in FIG. 3B, the second region 310 is disposed between the two ends 305, 307. The first region 308 of the exhaust baffle 204 comprises a shield surface 314 formed from a material that is impermeable to the etching gas, such that the etching gas is blocked from passing through portions of the exhaust baffle 204 comprised of solid regions of the shield surface 314.

The shield surface 314 defines a plurality of vent apertures 316. The number, size, shape, location, orientation relative to one another, etc. of the vent apertures 316 are such that the first region 308 of the exhaust baffle 204 restricts the flow path of the etching gas so as to promote uniform exposure of the substrate to the etching gas. In some embodiments, at least some vent apertures 316 are uniformly sized, uniformly shaped, uniformly spaced relative to a closest neighboring vent aperture, uniformly positioned relative an outer edge 309 of the exhaust baffle 204, and/or uniformly positioned relative to an inner edge 311 of the exhaust baffle 204. In some embodiments, at least some vent apertures 316 vary from one or more other vent apertures 316 in at least one of size, shape, location relative to at least one of the outer edge 309 of the exhaust baffle 204, the inner edge 311 of the exhaust baffle 204, distance to a closest neighboring vent aperture, or any other feature, characteristic, etc. In some embodiments, one or more vent apertures are a first size while one or more other vent apertures are a second size different than the first size. In some embodiments, one or more vent apertures are a first shape while one or more other vent apertures are a second shape different than the first shape. In some embodiments, a first distance between first and second vent apertures is different than a second distance between third and fourth vent apertures. In some embodiments, spacing between adjacent vent apertures increases to achieve desired etching gas flow restriction. In some embodiments, a first distance between a first vent aperture and a second vent aperture is different than a second distance between the second vent aperture and a third vent aperture.

For example, as shown in FIG. 3A, a first vent aperture 317 is rectangular in shape, while a second vent aperture 319 is trapezoidal. The first vent aperture 317 occupies or consumes a first amount or area of the exhaust baffle 204 to have a first cross-sectional flow area, while the second vent aperture occupies or consume a second, different, amount or area of the exhaust baffle 204 to have a second, different, cross-sectional flow area. In some embodiments, even though a first vent aperture and a second vent aperture have different shapes, they can each occupy or consume a same amount or area of the exhaust baffle 204, such as to have equal cross-sectional flow areas. In some embodiments, even though a first vent aperture and a second vent aperture have a same shape, they can each occupy or consume a different amount or area of the exhaust baffle 204, such as to have different cross-sectional flow areas. As another example, a third vent aperture 321 is defined by an outer wall 323 that is closer to the outer edge 309 of the exhaust baffle 204 than an outer wall 325 defining of a fourth vent aperture 327. As another example, a vent aperture, such as the third vent aperture 321, is defined by an inner wall 329 that is closer to the inner edge 311 of the exhaust baffle 204 than an inner wall 331 defining another vent aperture, such as the fourth vent aperture 327. As another example, one or more vent apertures, such as 334 and/or 336 in FIG. 3B, can have an altered orientation, such as a longest extent that is non-parallel to a radial direction of the exhaust baffle 204. For example, such vent apertures can be curved, arcuate, concentric to one another, and/or have any other configuration and/or orientation.

Any one or more of the foregoing and/or other feature(s), characteristic(s), etc. of the exhaust baffle 204 can be tailored to control or restrict the flow of gas along a path, where a restricted flow path imposes greater resistance to the flow of the etching gas than an unobstructed, or unbaffled flow of the etching gas. For example, in some embodiments, the sum of the cross-sectional flow areas of all of the vent apertures 316 is less than the total cross-sectional flow area of the aperture 312 defined by the second region 310 of the exhaust baffle 204.

In some embodiments, the first region 308 extends an angular extent Θ of between thirty (30°) degrees and two hundred seventy (270°) about the exhaust baffle 204. In some embodiments, the angular extent Θ of the first region 308 is between ninety (90°) degrees and one hundred eighty (180°) degrees about the annular exhaust baffle 204. In some embodiments, the second region 310 extends about the remaining angular extent of the exhaust baffle 204.

The relative restriction of the flow path by the first region 308 of the exhaust baffle 204 relative to the unrestricted flow path through the aperture 312 of the second region 310 modifies the flow of the etching gas through the interior space toward the exhaust port. In some embodiments, implementing the exhaust baffle 204 improves etch rate uniformity up to sixty (60%) as compared to etch rate uniformity achieved when the exhaust baffle 204 is not implemented. In some embodiments, implementing the exhaust baffle 204 eliminates or reduces C-shaped etching non-uniformities that otherwise exist when the exhaust baffle 204 is not implemented.

Figure 3C:
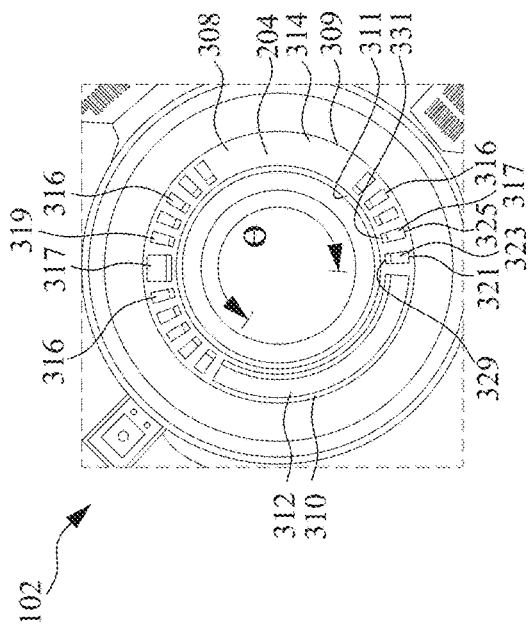
FIG. 3C illustrates an etch rate map indicating a relatively uniform etch rate over a surface of a substrate when an exhaust baffle is implemented in a process chamber, according to some embodiments.

FIG. 3C illustrates an etch rate map 300 that reveals a relatively uniform etch-rate over a surface of the substrate 200 when the exhaust baffle 204 is implemented, according to some embodiments. For example, portions of the surface of the substrate 200 located at fixed, defined radial distances from a center 320 of the substrate 200, represented by broken lines 318, are etched at approximately the same etch rate. In some embodiments, etch rates of regions within broken lines 318 are within a tolerance of up to twenty (20%) percent of each other. In some embodiments, etch rates of regions within broken lines 318 are within a tolerance of up to fifteen (15%) percent of each other. In some embodiments, etch rates of regions within broken lines 318 are within a tolerance of up to ten (10%) percent of each other.

At least one of the shield surface 314, the number, shape, size, location, distribution, etc. of the vent apertures 316, or the angular extent Θ of the first region 308 about the exhaust baffle 204 relative to the angular extent of the second region 310 improves the uniformity of the flow of the etching gas over the substrate 200. In some embodiments, improving the uniformity of the flow of the etching gas involves rendering the flow of the etching gas over the substrate 200 more uniform than an unbaffled flow of the etching gas over the substrate 200 that would be established without the exhaust baffle 204 supported within the flow path of the etching gas. However, other properties of the exhaust baffle 204 also promote improved uniformity of the flow of the etching gas over the substrate 200 without departing from the scope of the present disclosure.

Figure 4A:
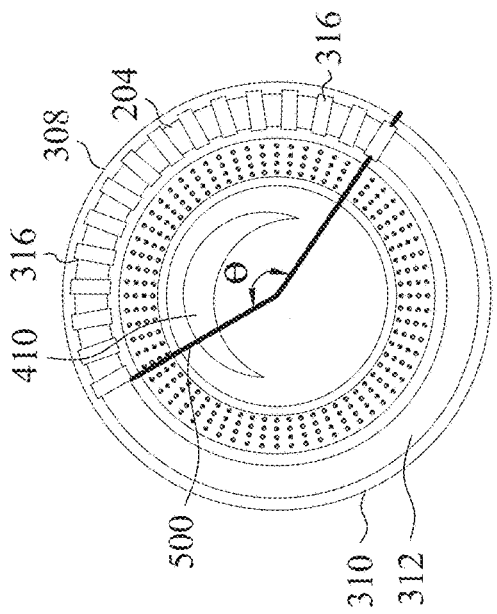
FIG. 4A illustrates a top view of an exhaust baffle having a first region defining a first density of vent apertures that restrict a flow path of an etching gas toward an exhaust port, according to some embodiments.
Figure 4C:
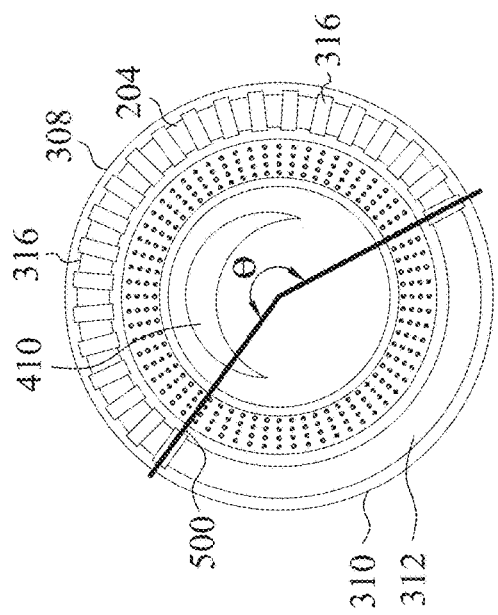
FIG. 4C illustrates a top view of an exhaust baffle having a first region defining the second density of vent apertures appearing in FIG. 4B, but extending over a different angular extent of the exhaust baffle, according to some embodiments.
Figure 4B:
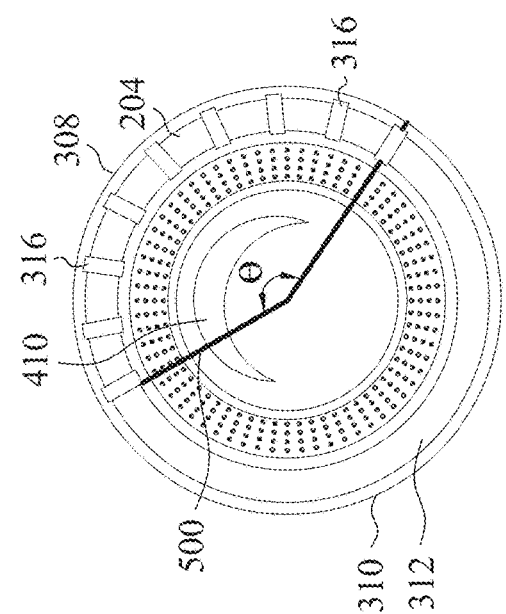
FIG. 4B illustrates a top view of an exhaust baffle having a first region defining a second density of vent apertures that restrict a flow path of an etching gas toward an exhaust port, according to some embodiments.

FIG. 4A, FIG. 4B, and FIG. 4C illustrate top views of exhaust baffles 204 having varying densities and distributions of vent apertures 316, according to some embodiments. A ratio of the area of the first region 308 of the exhaust baffle 204 comprising the shield surface 314 to the area of the first region 308 of the exhaust baffle 204 comprising vent apertures 316 or rather the sum of the cross-sectional flow areas of all of the vent apertures 316 influences the extent to which the flow path of the etching gas is restricted. For example, this ratio is approximately 1:1.5 in the embodiment of the exhaust baffle 204 shown in FIG. 4A. This ratio is approximately 1:1.25 in the embodiment of the exhaust baffle 204 shown in FIG. 4B. Thus, the embodiment of the exhaust baffle 204 in FIG. 4B has a greater percentage of the first region 308 comprised of vent apertures 316 than the embodiment of the exhaust baffle 204 in FIG. 4A, or rather the sum of the cross-sectional flow areas of all of the vent apertures 316 in the embodiment of the exhaust baffle 204 in FIG. 4B is greater than such sum in the embodiment of the exhaust baffle 204 in FIG. 4A. Accordingly, the embodiment of the exhaust baffle 204 in FIG. 4A imposes a greater restriction on the flow path of the etching gas than the embodiment of the exhaust baffle 204 in FIG. 4B.

The angular extent that the first region 308 comprising the vent apertures 316 extends over the exhaust baffle 204 also influences the restriction on the flow path of the etching gas. For example, the vent apertures 316 are formed in the first region 308 in FIG. 4B to establish a density corresponding to a ratio of approximately 1:1.25, as explained above. The vent apertures 316 are also formed in the first region 308 in FIG. 4C to establish a density corresponding to a ratio of approximately 1:1.25. However, the angular extent Θ over which the first region 308 extends in FIG. 3C is greater than the angular extent Θ over which the first region 308 extends in FIG. 3B. The embodiment of the exhaust baffle 204 in FIG. 4B imposes a greater restriction on the flow path of the etching gas than the embodiment of the exhaust baffle 204 in FIG. 4C, since the exhaust baffle 204 with the greater number of vent apertures 316 in the embodiment in FIG. 4C provides a larger flow path than the exhaust baffle 204 with the lesser number of vent apertures 316 in FIG. 4B.

The angular orientation of a portion of the exhaust baffle 204, such as the first region 308, relative to the crescent shaped aperture 410 also influences the restriction of the flow path of the etching gas. As shown in FIG. 4A and FIG. 4B, the angular extent Θ to which the first region 308 extends along the exhaust baffle 204 is approximately one hundred seventy (170°) degrees, as indicated by line 500. There is a greater overlap between the first region 308 of the exhaust baffle 204 and the crescent shaped aperture 410 as compared to the overlap between the second region 310 of the exhaust baffle 204 and the crescent shaped aperture 410. The ratio of the extent to which the first region 308 overlaps the crescent shaped aperture 410 to the extent to which the second region 310 overlaps the crescent shaped aperture 410 is selected to promote a relatively uniform etch rate over a surface of a substrate 200 in the process chamber 102.

Figure 5:
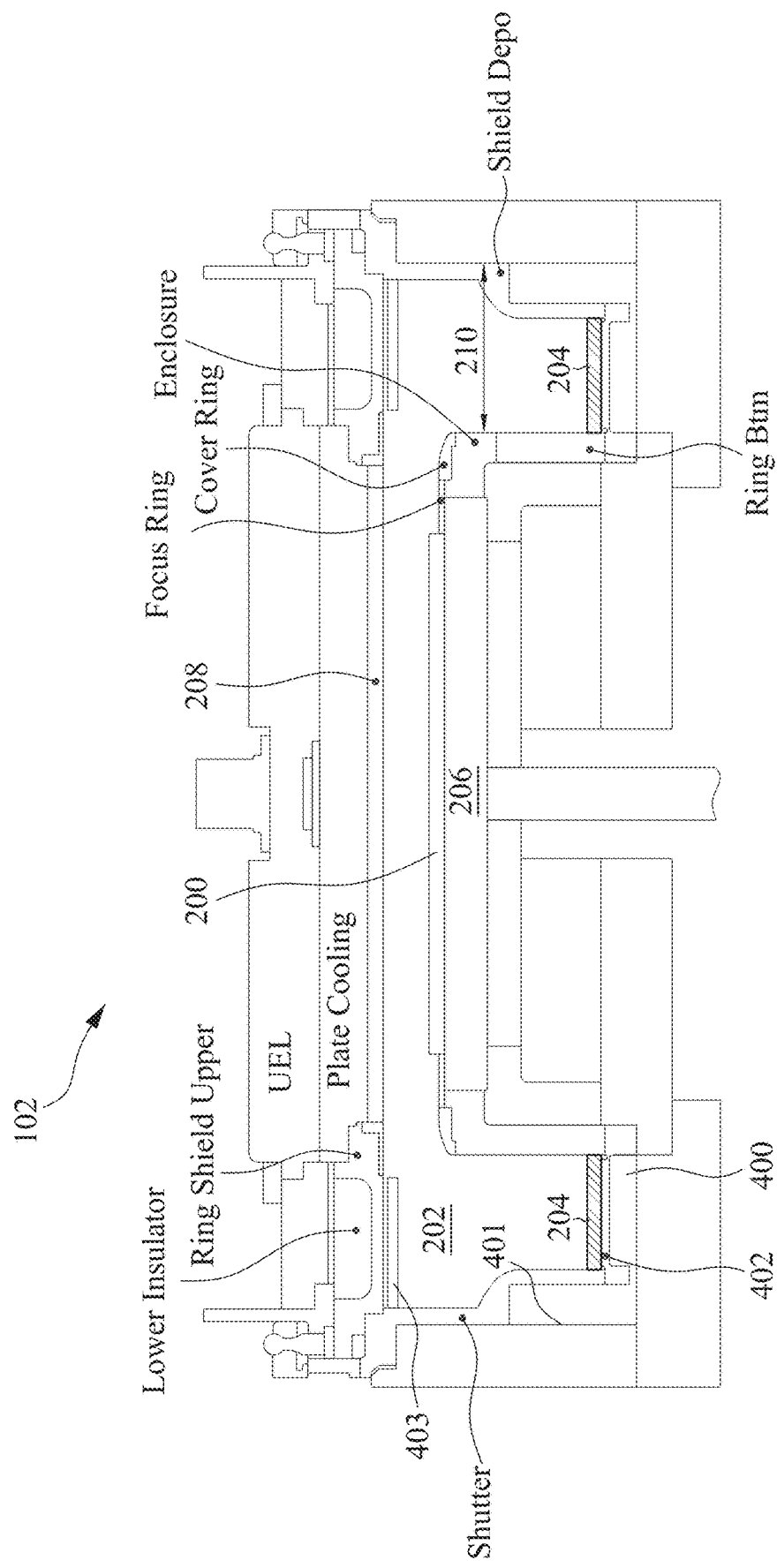
FIG. 5 illustrates a cross-sectional or cutaway view of a process chamber that promotes uniform etching on a substrate, according to some embodiments.

FIG. 5 illustrates a cross-sectional or partially cutaway view of at least some of the process chamber 102 including the exhaust baffle 204 that promotes uniform etching of the substrate 200, according to some embodiments. The process chamber 102 includes the peripheral wall 401, the floor 400, and ceiling 403, where the peripheral wall 401 extends between the floor 400 and the ceiling 403 to define the interior space 202. In some embodiments, the floor 400 is annular, the ceiling 403 is annular, and the peripheral wall 401 is cylindrical such that at least some of the interior space 202 is generally a cylindrical volume. In some embodiments the exhaust baffle 204 is annular in shape. In some embodiments, the exhaust baffle 204 is continuous. In some embodiments, the exhaust baffle 204 is not continuous so as to have two ends that do not touch.

A gas inlet port 208 is arranged between the interior space 202 and a gas source (not shown), and forms an internal passage through which the etching gas supplied by the gas source enters the interior space 202. The substrate 200 is supported by the substrate support 206 within the interior space 202 such that a surface of a substrate 200 is exposed to the etching gas. In some embodiments, the gas inlet port 208 includes a showerhead that introduces the etching gas to the interior space 202 in a distributed manner through a plurality of apertures formed in the showerhead.

In some embodiments, the substrate support 206 is disposed at a central region of the interior space 202. An annular channel 210 formed between the substrate support 206 and the peripheral wall 401 forms a flow path through which the etching gas travels toward the exhaust baffle 204 and then the exhaust port (not shown).

FIG. 6 illustrates a flow diagram depicting a method 600 of establishing a flow of an etching gas over a substrate 200, such as a semiconductor wafer, according to some embodiments. At 602 the etching gas supplied by the gas source 104 is introduced to the interior space 202 of the process chamber 102. The interior space 202 is defined by the peripheral wall 401, the floor 400, and the ceiling 403, where the peripheral wall 401 extends between the floor 400 and the ceiling 403. In some embodiments, the floor 400 is annular, the ceiling 403 is annular, and the peripheral wall 401 is cylindrical such that at least some of the interior space 202 is generally a cylindrical volume. The substrate 200 is supported on the substrate support 206 in the interior space 202. The etching gas is introduced into the interior space 202 through the gas inlet port 208 that establishes fluid communication between the gas source 104 and the interior space 202.

At 604 at least a portion of the etching gas is evacuated from the interior space 202 through the exhaust port 402 due to partial vacuum established by the vacuum source 110. The partial vacuum is generally at a lower pressure than a pressure within the interior space 202 of the process chamber 102 such that at least a portion of the etching gas moves along a flow path from the process chamber 102 to the vacuum source 110 through the exhaust port 402. According to some embodiments, the vacuum source 110 establishes at least a rough vacuum, having a pressure of less than 760 Torr, down to about 1 Torr. In some embodiments, the vacuum source 110 establishes at least a medium vacuum, having a pressure that is no greater than 1 Torr, down to about $1 \times 10^{-3}$ Torr. In some embodiments, the vacuum source 110 establishes at least a high vacuum, having a pressure that is no greater than $1 \times 10^{-3}$ Torr, down to about $1 \times 10^{-7}$ Torr. In some embodiments, the vacuum source 110 establishes at least an ultra-high vacuum, having a pressure that is less than $1 \times 10^{-7}$ Torr.

At 606 the flow of the etching gas is controlled by supporting the exhaust baffle 204 within the flow path of the etching gas being evacuated from the interior space through the exhaust port 402. In some embodiments, the exhaust baffle 204 is disposed proximate the exhaust port 402. In the absence of the exhaust baffle 204, given the dimension and location of the crescent shaped aperture, the etching gas would not be uniformly removed from the interior space 202 and would not uniformly flow across the substrate 200. For example, a first portion of the etching gas closer to the crescent shaped aperture would move at a first flow rate greater than a second flow rate of a second portion of the etching gas farther away from the crescent shaped aperture. The exhaust baffle 204 has the first region 308 that restricts, to the first degree, the flow path of the etching gas toward the exhaust port, and the second region 310 that restricts, to the second degree, different than the first degree, the flow path of the etching gas toward the exhaust port. In some embodiments, etching gas flows generally unrestricted through the second region 310 of the exhaust baffle 204, whereas flow of the etching gas is somewhat restricted through the first region 308 of the exhaust baffle 204. In some embodiments, the first region 308 defines the plurality of vent apertures 316. In some embodiments, the plurality of vent apertures 316 have the collective cross-sectional flow area that is less than the cross-sectional flow area of the aperture defined by the second region 310 of the exhaust baffle 204. The exhaust baffle 204 is positioned relative to the crescent shaped aperture such that the first region 308 and the second region 310 facilitate uniform removal of the etching gas from the interior space 202 and thereby uniform flow of the etching gas across the substrate 200 to promote uniform etching of the substrate 200. A first flow rate of a first portion of the etching gas over a first portion of the substrate is generally not different than a second flow rate of a second portion of the etching gas over a second portion of the substrate due to the orientation of the exhaust baffle 204 relative to the exhaust port 402. The exhaust baffle 204 can be any size, shape, dimension, material, have any distribution of vent apertures 316, etc. so as to facilitate uniform removal of the etching gas from the interior space 202 and thereby uniform flow of the etching gas across the substrate 200. The exhaust baffle 204 can be annular, continuous, discontinuous, such as having two ends that do not touch, etc. At least some vent apertures 316 can vary from one or more other vent apertures 316 in at least one of size, shape, location relative to a reference exhaust baffle 204, distance to a closest neighboring vent aperture, or any other feature, characteristic, etc. In some embodiments, the first region 308 extends the angular extent Θ of between thirty (30°) degrees and two hundred seventy (270°) about the exhaust baffle 204. In some embodiments, the angular extent Θ of the first region 308 is between ninety (90°) degrees and one hundred eighty (180°) degrees about the annular exhaust baffle 204. In some embodiments, the second region 310 extends about the remaining angular extent of the exhaust baffle 204. In some embodiments, the ratio of the area of the first region 308 of the exhaust baffle 204 comprising the shield surface 314 to the area of the first region 308 of the exhaust baffle 204 comprising vent apertures 316 is at least one of approximately 1:1.5 or approximately 1:1.25. In some embodiments, the first region 308 overlaps approximately seventy-five (75%) percent of the crescent shaped aperture 410.

In some embodiments, a process chamber for semiconductor fabrication is provided. The process chamber includes a peripheral wall extending upward from a floor to define an interior space and a substrate support disposed within the interior space. The process chamber includes a gas inlet port through which a process gas enters the interior space to be exposed to a surface of a substrate supported by the substrate support. The process chamber includes an exhaust port through which the process gas is removed from the interior space, wherein the exhaust port is configured to be fluidly coupled to a vacuum source to generate a vacuum that establishes a flow of the process gas over the substrate supported by the substrate support. The process chamber includes an exhaust baffle supported within a flow path of the process gas being removed from the interior space through the exhaust port, wherein the exhaust baffle comprises a first region that restricts to a first degree the flow path of the process gas toward the exhaust port, and a second region that restricts to a second degree, different than the first degree, the flow path of the process gas toward the exhaust port.

In some embodiments, a semiconductor processing system is provided. The semiconductor processing system includes a gas source that supplies a process gas, a vacuum source, and a process chamber. The process chamber includes a peripheral wall extending upward from a floor to define an interior space, a substrate support disposed within the interior space, a gas inlet port through which the process gas enters the interior space to be exposed to a surface of a substrate supported by the substrate support, a vacuum aperture in fluid communication with the vacuum source, wherein the vacuum source establishes a partial vacuum at the vacuum aperture to establish a flow of the process gas through the process chamber, an exhaust port through which the process gas is removed from the interior space, wherein the vacuum aperture is offset from the exhaust port, and an exhaust baffle supported adjacent to the exhaust port within a flow path of the process gas being removed from the interior space through the exhaust port, wherein the exhaust baffle comprises a first region that restricts to a first degree the flow path of the process gas toward the exhaust port, and a second region that restricts to a second degree, different than the first degree, the flow path of the process gas toward the exhaust port, and wherein a portion of the first region of the exhaust baffle is arranged in vertical alignment with a portion of the vacuum aperture to influence the flow of the process gas through the process chamber.

In some embodiments, a method is provided. The method includes introducing a process gas into an interior space of a process chamber through a gas inlet port, wherein a substrate is supported within the interior space, evacuating the process gas from the interior space by a vacuum source through an exhaust port in fluid communication with the interior space of the process chamber, and controlling a flow of the process gas established by evacuating the process gas with the vacuum source by supporting an exhaust baffle within a flow path of the process gas being evacuated from the interior space through the exhaust port.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method comprising:
   introducing a process gas into an interior space of a process chamber through a gas inlet port, wherein a substrate is supported within the interior space;

evacuating the process gas from the interior space by a vacuum source through an exhaust port in fluid communication with the interior space of the process chamber; and
controlling a flow of the process gas established by evacuating the process gas with the vacuum source by supporting an exhaust baffle within a flow path of the process gas being evacuated from the interior space through the exhaust port, wherein controlling the flow of the process gas comprises:
controlling a seal member to overlap a portion of the exhaust port to define a crescent shaped aperture.

2. The method of claim 1, wherein controlling the flow of the process gas comprises:
restricting to a first degree, with a first region of the exhaust baffle, the flow path of the process gas toward the exhaust port; and
restricting to a second degree, different than the first degree, with a second region of the exhaust baffle, the flow path of the process gas toward the exhaust port.

3. The method of claim 1, wherein controlling the flow of the process gas comprises:
establishing a substantially uniform etch rate of the substrate.

4. The method of claim 1, wherein controlling the flow of the process gas comprises:
arranging the exhaust baffle such that a first angular extent of a first region of the exhaust baffle defining a plurality of vent apertures overlaps with a second angular extent of the exhaust port.

5. The method of claim 1, wherein controlling the flow of the process gas comprises:
arranging the exhaust baffle such that a first region of the exhaust baffle defining a plurality of vent apertures overlaps with the crescent shaped aperture.

6. The method of claim 1, wherein controlling the seal member comprises:
using a pendulum that is pivotally adjustable to move the seal member in an angular direction relative to an edge of the process chamber.

7. The method of claim 1, wherein:
the exhaust baffle is annular, and
controlling the flow of the process gas comprises:
pulling the process gas through a first vent aperture defined by the exhaust baffle and having a longest dimension extending in a radial direction of the exhaust baffle.

8. The method of claim 7, wherein controlling the flow of the process gas comprises:
pulling the process gas through a second vent aperture defined by the exhaust baffle and having a longest dimension extending in a first direction different than the radial direction of the exhaust baffle.

9. The method of claim 1, wherein:
the exhaust baffle is annular,
the exhaust baffle defines a first region having a plurality of first vent apertures and a second region having a second vent aperture, and
controlling the flow of the process gas comprises:
pulling the process gas through the plurality of first vent apertures, wherein at least one first vent aperture of the plurality of first vent apertures has a longest dimension extending in a radial direction of the exhaust baffle, and
pulling the process gas through the second vent aperture having a longest dimension extending in a circumferential direction of the exhaust baffle.

10. The method of claim 9, wherein controlling the flow of the process gas comprises:
pulling the process gas through a third vent aperture defined in the first region and having a longest dimension extending in a first direction different than the radial direction and different than the circumferential direction of the exhaust baffle.

11. The method of claim 9, wherein the plurality of first vent apertures comprise a total cross-sectional flow area that is less than a cross-sectional flow area of the second vent aperture.

12. A method comprising:
evacuating a process gas from an interior space of a process chamber through an exhaust port;
controlling a seal member to overlap a portion of the exhaust port to define a crescent shaped aperture; and
controlling a flow of the process gas established by evacuating the process gas by arranging an exhaust baffle overlying the seal member and comprising a plurality of vent apertures within a flow path of the process gas being evacuated from the interior space through the exhaust port.

13. The method of claim 12, wherein a total cross-sectional flow area of a first portion of the plurality of vent apertures overlying the crescent shaped aperture is less than a total cross-sectional flow area of a second portion of the plurality of vent apertures not overlying the crescent shaped aperture.

14. The method of claim 12, wherein controlling the seal member comprises:
using a pendulum that is pivotally adjustable to move the seal member in an angular direction relative to an edge of the process chamber to change a cross-sectional area of the crescent shaped aperture.

15. The method of claim 12, wherein:
the exhaust baffle is annular, and
controlling the flow of the process gas comprises:
pulling the process gas through a first vent aperture of the plurality of vent apertures and having a longest dimension extending in a first direction different than a radial direction of the exhaust baffle.

16. The method of claim 15, wherein controlling the flow of the process gas comprises:
pulling the process gas through a second vent aperture of the plurality of vent apertures having a longest dimension extending in the radial direction of the exhaust baffle.

17. A method comprising:
introducing a process gas into an interior space of a process chamber through a gas inlet port, wherein a substrate is supported within the interior space;
evacuating the process gas from the interior space of the process chamber by a vacuum source through an exhaust port in fluid communication with the interior space of the process chamber; and
controlling a flow of the process gas established by evacuating the process gas with the vacuum source by supporting an exhaust baffle within a flow path of the process gas being evacuated from the interior space through the exhaust port, wherein:
the exhaust baffle is annular, and
controlling the flow of the process gas comprises:
controlling a seal member to overlap a portion of the exhaust port to define a crescent shaped aperture; and
pulling the process gas through a first vent aperture defined by the exhaust baffle and having a longest dimension extending in a first direction different than a radial direction of the exhaust baffle.

18. The method of claim 17, wherein controlling the flow of the process gas comprises:
   pulling the process gas through a second vent aperture defined by the exhaust baffle and having a longest dimension extending in a circumferential direction of the exhaust baffle, the circumferential direction different than the first direction.

19. The method of claim 17, wherein controlling the flow of the process gas comprises:
   arranging the exhaust baffle such that a first region of the exhaust baffle defining a plurality of vent apertures overlaps with the crescent shaped aperture.

20. The method of claim 17, wherein controlling the seal member comprises:
   using a pendulum that is pivotally adjustable to move the seal member in an angular direction relative to an edge of the process chamber.

\* \* \* \* \*